(12) United States Patent
Aronowitz et al.

(10) Patent No.: US 6,822,308 B2
(45) Date of Patent: Nov. 23, 2004

(54) METHOD OF CHEMICALLY ALTERING A SILICON SURFACE AND ASSOCIATED ELECTRICAL DEVICES

(75) Inventors: Sheldon Aronowitz, San Jose, CA (US); Vladimir Zubkov, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 74 days.

(21) Appl. No.: 10/600,665

(22) Filed: Jun. 20, 2003

(65) Prior Publication Data

US 2003/0235988 A1 Dec. 25, 2003

Related U.S. Application Data

(62) Division of application No. 10/131,431, filed on Apr. 24, 2002, now Pat. No. 6,627,556.

(51) Int. Cl.⁷ .............................................. H01L 29/00
(52) U.S. Cl. ...................... 257/501; 257/501; 257/410
(58) Field of Search ................................ 257/501, 410, 257/304, 310, 311, 506; 438/710, 216

(56) References Cited

U.S. PATENT DOCUMENTS

| | | |
|---|---|---|
| 4,022,872 A | 5/1977 | Carson et al. |
| 4,073,902 A | 2/1978 | Scartazzini et al. |
| 4,113,591 A | 9/1978 | Laundon et al. |
| 4,147,864 A | 4/1979 | Woodward et al. |
| 4,255,328 A | 3/1981 | Woodward et al. |
| 4,269,977 A | 5/1981 | Peter et al. |
| 4,329,517 A | 5/1982 | Taniguchi et al. |
| 4,405,778 A | 9/1983 | Scartazzini et al. |
| 4,765,920 A | 8/1988 | Gattuso et al. |
| 6,297,539 B1 * | 10/2001 | Ma et al. ..................... 257/410 |
| 6,355,821 B1 | 3/2002 | Koplick et al. |
| 2002/0182529 A1 | 12/2002 | Hoshi et al. |
| 2002/0192604 A1 | 12/2002 | Ishikawa et al. |
| 2003/0013043 A1 | 1/2003 | Inno et al. |

* cited by examiner

*Primary Examiner*—David Nelms
*Assistant Examiner*—Thinh T Nguyen
(74) *Attorney, Agent, or Firm*—Barnes & Thornburg

(57) ABSTRACT

A method of chemically altering a silicon surface and associated dielectric materials are disclosed.

6 Claims, No Drawings

METHOD OF CHEMICALLY ALTERING A SILICON SURFACE AND ASSOCIATED ELECTRICAL DEVICES

This application is a divisional application of U.S. patent application Ser. No. 10/131,431 which was filed on Apr. 24, 2002 now U.S. Pat. No. 6,627,556 and is incorporated herein by reference.

FIELD

The present disclosure relates generally to a method of chemically altering a silicon surface and electrical devices having the chemically altered silicon surface. The present disclosure particularly relates to the creation of a dielectric material on a semiconductor device utilizing atomic layer deposition.

BACKGROUND

The shrinking of the field-effect device channel length requires an increase in the capacitance of the gate dielectric in order to achieve desired performance. There are difficulties associated with decreasing the oxide thickness in a reproducible fashion when that gate dielectric is $SiO_2$. Leakage currents are unacceptable when the oxide thickness is less than 1.2 nm. An alternative approach has been to deposit high-k dielectrics. However, a difficulty with this approach is that, in general, these materials are mismatched with the underlying silicon lattice. This leads to formation of additional interface states, which degrades the device performance. These relatively high dielectric material display temperature sensitivity with respect to micro-crystal formation, migration phenomenon, and relatively low intrinsic dielectric constants. In addition, these materials are not easy to alter or modify.

SUMMARY

According to one illustrative embodiment, there is provided a method of chemically altering a silicon surface. The method includes (a) reacting a halide of a first element having only one positive divalent oxidation state with a hydroxyl group bound to a silicon atom of the silicon surface so as to chemically couple the first element to the silicon atom of the silicon surface, (b) hydrolyzing a bond between a halogen atom and an atom of the first element so as to generate a hydroxyl group bound to the atom of the first element, and (c) reacting a halide of a second element that has a trigonal bipyramidal structure with the hydroxyl group bound to the atom of the first element so as to chemically couple the halide of the second element to the atom of the first element.

According to another illustrative embodiment, there is provided an electronic device. The electronic device includes a silicon substrate with an atom of an element having only one positive divalent oxidation state chemically coupled to a silicon atom of the silicon substrate. The electronic device also includes a trigonal bipyramidal moiety chemically coupled to the atom having only one positive divalent oxidation state.

According to yet another illustrative embodiment, there is provided a semiconductor device. The semiconductor device includes a dielectric material which has an atom of an element having only one positive divalent oxidation state chemically coupled to a silicon atom of a silicon substrate of the dielectric material. The semiconductor device also includes a trigonal bipyramidal moiety chemically coupled to the atom of the element having only one positive divalent oxidation state.

DETAILED DESCRIPTION OF THE DISCLOSURE

While the invention is susceptible to various modifications and alternative forms, specific exemplary embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within in the spirit and scope of the invention.

The present disclosure relates to altering a silicon surface so as to create a dielectric material on the silicon surface. For example, the aforementioned silicon surface can be defined on an electronic device, such as a semiconductor wafer, by a silicon substrate. Initially the silicon surface to be altered in accordance with the present disclosure is cleaned with any known appropriate cleaning solution to remove oxides therefrom. After removing oxides from the silicon surface in the aforementioned manner, the surface is exposed to a hydrolyzing atmosphere such that the silicon atoms on the surface to be altered have a free hydroxyl group covalently bound thereto. For example, contacting the silicon surface with steam or vaporized hydrogen peroxide in a known manner can be utilized to generate free hydroxyl groups covalently bound to the silicon atoms.

After preparing the silicon surface in the above described manner, the hydroxyl groups bound to the silicon atoms are reacted with a halide of an element that exhibits only one positive divalent oxidation state. What is meant herein by a "halide" is a compound of the type $MX_n$, where X is a halogen (e.g. chlorine) and M is another element. With respect to elements that exhibit only one positive divalent oxidation state, examples of such elements are those contained in groups IIA and IIB of the periodic table. For example, calcium of group IIA or cadmium of group IIB can be utilized as the aforementioned element which exhibits only one positive divalent oxidation state. To initiate the alteration, a stoichiometric excess of the aforementioned halide relative to the hydroxyl groups is placed in contact with the silicon surface under vacuum conditions in a reaction chamber. In particular, the halide is introduced into the reaction chamber in gaseous form so that the halide contacts the silicon surface. Note that as used herein "vacuum conditions" means that gas is being removed from the reaction chamber so that the pressure in the reaction chamber is less that atmospheric. The silicon surface (e.g. the silicon surface of an electrical device such as a semiconductor wafer) is then heated at a sufficient temperature (e.g. about 200° C. to about 300° C.) such that (i) the halide reacts with the hydroxyls from the underlying silicon surface and (ii) the unreacted halide is vaporized and removed from the reaction chamber. An example of this initial alteration of the silicon surface is schematically illustrated below with the cadmium chloride ($CdCl_2$):

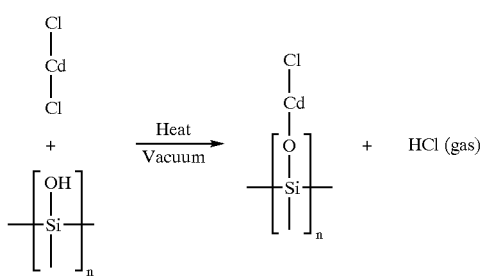

Note that the unreacted cadmium chloride has a vapor pressure of about 8 mTorr at 412° C. and thus can be removed under vacuum conditions with the hydrogen chloride (HCl) gas product as a by-product of the cadmium chloride/silicon surface reaction. It should be understood that, preferably, all by-products of the surface reaction, including all of the by-products of the surface reaction products described below, should be removed from the reaction chamber as quickly as possible (e.g. via a vacuum pump) so as to ensure the surface reaction is driven to completion. As illustrated above, the reaction of the halide with the silicon surface results in the halide being chemically coupled to a silicon atom of the silicon substrate via a covalent bond with the oxygen atom of the hydroxyl group.

After reacting the silicon surface with the halide in the above described manner, the surface is heated (e.g. to about 200° C.) under vacuum conditions and exposed to vaporized hydrogen peroxide ($H_2O_2$), or a stream of vaporized water ($H_2O$) and ammonia ($NH_3$), or vaporized water ($H_2O$) so as to hydrolyze bonds between halogen atoms and atoms of the element that exhibits only one positive divalent oxidation state and thereby generate a hydroxyl group bound to atoms of the element. The process of hydrolyzing bonds between halogen atoms and atoms of the element is schematically illustrated below with hydrogen peroxide:

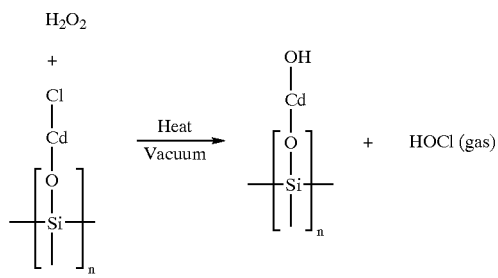

As illustrated above, hydrolyzing bonds between halogen atoms and atoms of the element results in atoms of the element being covalently bound to a hydroxyl group.

After hydrolyzing bonds between halogen atoms and atoms of the element as described above, the chemically altered silicon surface is reacted with a halide of an element that has a trigonal bipyramidal structure. For example, a pentahalide of an element selected from group VB of the periodic table can be reacted with the silicon surface. Preferably, trigonal bipyramidal halide molecules having a niobium atom or a tantalum atom as the central atom of the molecule is reacted with the chemically altered silicon surface. For example, niobium pentachloride or tantalum pentachloride can be reacted with the silicon surface after the above described hydrolysis step. To initiate the reaction, a stoichiometric excess of the aforementioned trigonal bipyramidal halide molecule relative to the hydroxyl groups bound to the element is placed in contact with the silicon surface under vacuum conditions in a reaction chamber. In particular, the trigonal bipyramidal halide molecule is advanced into the reaction chamber so as to contact the silicon surface. For example, niobium pentachloride heated to 160° C. has a vapor pressure of about 9 mTorr and thus can be advanced into the reaction chamber in a gaseous form and reacted with the silicon surface. As another example, tantalum pentachloride heated to 50° C. has a vapor pressure of about 9 mTorr and thus can be advanced into the reaction chamber in a gaseous form and reacted with the silicon surface. In particular, the silicon surface is heated at a sufficient temperature (e.g. about 200° C. to about 300° C.) in the presence of the gaseous trigonal bipyramidal halide such that (i) the trigonal bipyramidal halide reacts with the hydroxyls bound to the element and (ii) the unreacted trigonal bipyramidal halide is vaporized and removed from the reaction chamber. It should be understood that the trigonal bipyramidal halide can be reacted with the hydroxyls bound to the element in the presence of ammonia at a stoichiometric ratio of about 1:1 with the trigonal bipyramidal halide if desired. An example of this reaction is schematically illustrated below with the trigonal bipyramidal halide niobium pentachloride:

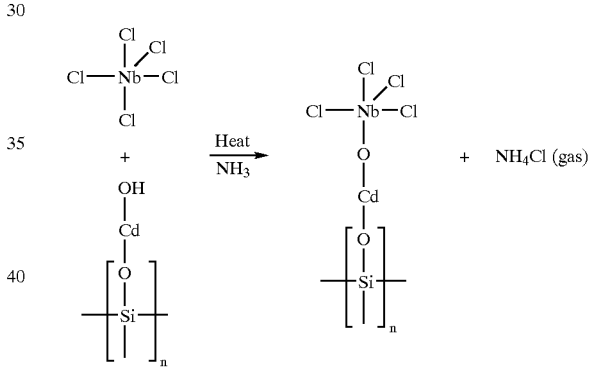

As illustrated above, the reaction of trigonal bipyramidal halide molecules with the hydroxyls bound to the element results in a trigonal bipyramidal moiety being chemically coupled to a silicon atom of the surface via a covalent bond with the oxygen atom bound to the element.

After reacting the chemically altered silicon surface with trigonal bipyramidal halide molecules in the above described manner, bonds between halogen atoms and the central atom of the trigonal bipyramidal moiety are hydrolyzed so as to generate hydroxyl groups bound to the central atom. For example, the silicon surface is heated (e.g. from about 200° C. to about 300° C.) under vacuum conditions and exposed to vaporized hydrogen peroxide ($H_2O_2$), or a stream of vaporized water and ammonia ($NH_3$), or vaporized water ($H_2O$) so as to hydrolyze bonds between halogen atoms and the central atom of the trigonal bipyramidal moiety. An example of this reaction is schematically illustrated below:

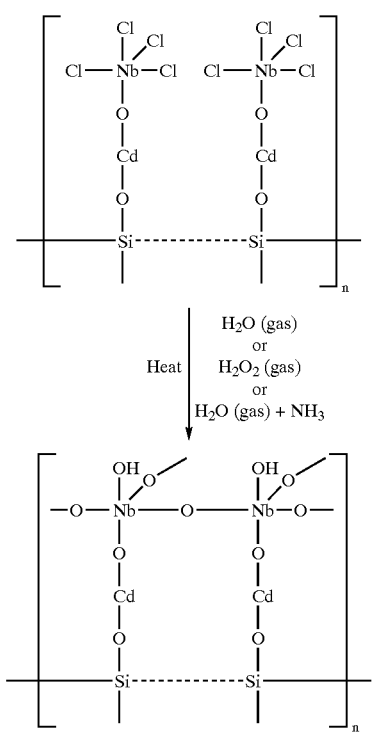

As illustrated above, it should be appreciated that heating the silicon surface in the above described manner also results in the condensation of trigonal bipyramidal moiety hydroxyl groups which are positioned in the plane that is parallel to the plane defined by the silicon atoms. For example, the hydroxyl of a trigonal bipyramidal moiety which is positioned in the parallel plane is condensed with a hydroxyl group of an adjacent trigonal bipyramidal moiety which is also positioned in the parallel plane.

The above described process can then be started over so as to dispose another layer of dielectric material onto the silicon surface. For example, to initiate a second cycle of deposition of a dielectric material onto the silicon surface, as described above, cadmium chloride ($CdCl_2$) is introduced into the reaction chamber to react with the free hydroxyl groups bound to niobium atoms. For example, cadmium chloride is reacted with the hydroxyl groups extending above the plane which is parallel to the plane defined by the silicon atoms. Thereafter, hydroxyls are introduced onto the cadmium atoms and then the hydroxyls are reacted with trigonal bipyramidal halide molecules with the subsequent introduction and condensation of hydroxyls on the trigonal bipyramidal moieties.

It should be appreciated that various combinations of dielectric layers are possible. For example, magnesium or calcium can be used in place of cadmium. In addition, it should be appreciated that, for example, layers of niobate can be alternated with tantalate layers. It should also be understood that although the illustration employed a chloride salt, the other halide salts (bromide and iodide) can be used. Thermodynamically, use of the bromide and iodide will not cause any difficulty for the group IIA elements but the cadmium (group IIB) iodide might not be sufficiently reactive. It should also be understood that the capability to vary the layer composition also allows a flexibility in creating dielectric materials on a silicon surface with a relatively wide range of dielectric constants. The dielectric constant can vary between the low twenties to almost an order of magnitude higher. The dielectric structure disclosed herein helps to minimize leakage paths since each niobate or tantalate layer is isolated from another niobate or tantalate layer by an atomic scale insulator. Accordingly, the methods and dielectric materials described herein help minimize (i) excess interface state creation due to structural mismatches and (ii) micro-crystal formation. The methods and dielectric materials described herein also (i) offer ease in modifying the intrinsic construction of a dielectric material and (ii) provide a choice from a range of dielectric constants.

While the disclosure is susceptible to various modifications and alternative forms, specific exemplary embodiments thereof have been shown by way of example in the drawings and has herein been described in detail. It should be understood, however, that there is no intent to limit the disclosure to the particular forms disclosed, but on the contrary, the intention is to cover all modifications, equivalents, and alternatives falling within the spirit and scope of the disclosure.

There are a plurality of advantages of the present disclosure arising from the various features of the apparatus and methods described herein. It will be noted that alternative embodiments of the apparatus and methods of the present disclosure may not include all of the features described yet still benefit from at least some of the advantages of such features. Those of ordinary skill in the art may readily devise their own implementations of an apparatus and method that incorporate one or more of the features of the present disclosure and fall within the spirit and scope of the present disclosure.

What is claimed is:

1. An electronic device, comprising:

a silicon substrate;

an atom of an element having only one positive divalent oxidation state chemically coupled to a silicon atom of said silicon substrate; and a trigonal bipyramidal moiety chemically coupled to said atom of said element having only one positive divalent oxidation state.

2. The device of claim 1, wherein:

said atom of said element having only one positive divalent oxidation state is an atom of an element selected from group IIA of the periodic table.

3. The device of claim 1, wherein:

said atom of said element having only one positive divalent oxidation state is an atom of an element selected from group IIB of the periodic table.

4. The device of claim 1, wherein:

said trigonal bipyramidal moiety has a central atom and said central atom is selected from the group consisting of a niobium atom and a tantalum atom.

5. A semiconductor device, comprising:

a dielectric material which includes an atom of an element having only one positive divalent oxidation state chemically coupled to a silicon atom of a silicon substrate of said dielectric material; and a trigonal bipyramidal moiety chemically coupled to said atom of said element having only one positive divalent oxidation state.

6. The device of claim 5, wherein:

said trigonal bipyramidal moiety has a central atom and said central atom is selected from the group consisting of niobium and tantalum.

* * * * *